US011335565B2

(12) United States Patent
Chen et al.

(10) Patent No.: US 11,335,565 B2
(45) Date of Patent: *May 17, 2022

(54) SYSTEMS AND METHODS TO FORM AIRGAPS

(71) Applicant: Applied Materials, Inc., Santa Clara, CA (US)

(72) Inventors: Zhijun Chen, San Jose, CA (US); Lin Xu, Fremont, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/840,944

(22) Filed: Apr. 6, 2020

(65) Prior Publication Data

US 2020/0234971 A1 Jul. 23, 2020

Related U.S. Application Data

(63) Continuation of application No. 16/288,311, filed on Feb. 28, 2019, now Pat. No. 10,615,047.

(Continued)

(51) Int. Cl.
*H01L 21/311* (2006.01)
*H01L 21/02* (2006.01)

(52) U.S. Cl.
CPC .............. *H01L 21/31116* (2013.01)

(58) Field of Classification Search
None
See application file for complete search history.

(56) References Cited

U.S. PATENT DOCUMENTS 9,343,272 B1 * 5/2016 Pandit ............... H01J 37/32412
10,529,583 B2   1/2020 Iwano et al.
(Continued)

FOREIGN PATENT DOCUMENTS

JP    2009-111049 A    5/2009
JP    2014-507073 A    3/2014
(Continued)

OTHER PUBLICATIONS

International Search Report and Written Opinion dated Jun. 11, 2019 in International Patent Application No. PCT/US2019/019866, 9 pages.

*Primary Examiner* — Shamim Ahmed
(74) *Attorney, Agent, or Firm* — Kilpatrick Townsend & Stockton LLP (57) ABSTRACT

Exemplary etching methods may include flowing a fluorine-containing precursor into a substrate processing region of a semiconductor processing chamber. The methods may include flowing a hydrogen-containing precursor into the substrate processing region. The methods may include contacting a substrate housed in the substrate processing region with the fluorine-containing precursor and the hydrogen-containing precursor. The substrate may include a trench or recessed feature, and a spacer may be formed along a sidewall of the trench or feature. The spacer may include a plurality of layers including a first layer of a carbon-containing or nitrogen-containing material and a second layer of an oxygen-containing material. The methods may also include removing the oxygen-containing material.

19 Claims, 6 Drawing Sheets

Related U.S. Application Data (60) Provisional application No. 62/636,725, filed on Feb. 28, 2018.

(56) References Cited

U.S. PATENT DOCUMENTS

| | | |
|---|---|---|
| 10,615,047 B2 | 4/2020 | Chen et al. |
| 10,872,778 B2 * | 12/2020 | Chen ................ H01L 21/67063 |
| 2009/0298256 A1 | 12/2009 | Chen et al. |
| 2013/0320550 A1 | 12/2013 | Kim |
| 2015/0221541 A1 | 8/2015 | Nemani et al. |
| 2015/0332953 A1 | 11/2015 | Futase et al. |
| 2016/0056235 A1 | 2/2016 | Lee et al. |
| 2017/0040180 A1 | 2/2017 | Xu et al. |
| 2019/0027371 A1 | 1/2019 | Yamasaki et al. |

FOREIGN PATENT DOCUMENTS

| | | |
|---|---|---|
| TW | 201417173 A | 5/2014 |
| TW | 2016-20041 A | 6/2016 |
| TW | 2017-06988 A | 2/2017 |
| TW | 201729283 A | 8/2017 |
| TW | 2018-06030 A | 2/2018 |

\* cited by examiner

SYSTEMS AND METHODS TO FORM AIRGAPS

CROSS-REFERENCE TO RELATED APPLICATIONS

This application is a continuation of U.S. application Ser. No. 16/288,311, filed Feb. 28, 2019, now U.S. Pat. No. 10,615,047, which claims the benefit of U.S. Provisional Application No. 62/636,725, filed Feb. 28, 2018, both of which are hereby incorporated by reference in their entirety for all purposes.

TECHNICAL FIELD

The present technology relates to semiconductor processes and equipment. More specifically, the present technology relates to selectively etching high-aspect-ratio structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include flowing a fluorine-containing precursor into a substrate processing region of a semiconductor processing chamber. The methods may include flowing a hydrogen-containing precursor into the substrate processing region. The methods may include contacting a substrate housed in the substrate processing region with the fluorine-containing precursor and the hydrogen-containing precursor. The substrate may include a trench or recessed feature, and a spacer may be formed along a sidewall of the trench or feature. The spacer may include a plurality of layers including a first layer of a carbon-containing and/or nitrogen-containing material, a second layer of an oxygen-containing material, and a third layer of a carbon-containing and/or nitrogen-containing material. The second layer of the spacer may be disposed between the first layer and third layer of the spacer. The methods may also include removing the oxygen-containing material.

In some embodiments, the hydrogen-containing precursor may be maintained fluidly isolated from a plasma formable within the semiconductor processing chamber in a remote plasma region of the semiconductor processing chamber. The hydrogen-containing precursor may be or include water vapor. The fluorine-containing precursor may be or include anhydrous hydrogen fluoride. Each layer of the spacer may be characterized by an aspect ratio greater than or about 20:1. The oxygen-containing material may be characterized by a width of less than or about 5 nm. A temperature of the substrate may be maintained below or about 10° C. during the etching method. The spacer may further include a fourth layer positioned between the second layer and the third layer. The fourth layer may be an oxygen-containing material. The fourth layer of the spacer may be characterized by a stoichiometrically lower amount of oxygen than the second layer of the spacer. The substrate processing region may be maintained plasma free during the etching method.

The present technology may also encompass removal methods. The methods may include flowing a fluorine-containing precursor into a substrate processing region of a semiconductor processing chamber. The methods may include flowing water vapor into the substrate processing region. The methods may include contacting a substrate housed in the substrate processing region with the fluorine-containing precursor and the water vapor. The substrate may include a trench, and a spacer may be formed along a sidewall of the trench. The spacer may include a plurality of lateral layers including a first layer of a carbon-containing material adjacent a sidewall of the trench, a second layer comprising an oxygen-containing material, and a third layer of a carbon-containing material. The second layer of the spacer may be disposed between the first layer of the spacer and third layer of the spacer. The methods may include maintaining a relative humidity within the substrate processing region of the semiconductor processing chamber below or about 60%. The methods may include removing the second layer of the spacer.

In some embodiments the second layer of the spacer may be or include a first oxygen-containing layer adjacent the first layer of the spacer and a second oxygen-containing layer adjacent the third layer of the spacer. The second oxygen-containing layer may be characterized by a lower oxygen content than the first oxygen-containing layer. Removing the second layer of the spacer may include removing the first oxygen-containing layer in a top-to-bottom etch. Removing the second layer of the spacer may also include subsequently removing the second oxygen-containing layer in a lateral etch. The first layer of the spacer and the third layer of the spacer may be substantially maintained during the second layer removal. The second layer of the spacer may be removed at a selectivity relative to the third layer of the spacer of greater than or about 50:1. The first layer of the spacer and the third layer of the spacer may be or include silicon nitride or silicon carbon nitride. The second layer of the spacer may extend beneath the third layer of the spacer. The methods may also include laterally etching the second spacer layer from beneath the third layer of the spacer. The fluorine-containing precursor may be anhydrous hydrogen fluoride. The substrate processing region may be maintained plasma-free during the removal method.

The present technology may also encompass etching methods. The methods may include flowing anhydrous hydrogen fluoride into a substrate processing region of a semiconductor processing chamber. The methods may include flowing water vapor into the substrate processing region. The methods may include contacting a substrate housed in the substrate processing region with the anhydrous hydrogen fluoride and the water vapor. The substrate may include a trench, and a spacer may be formed along a sidewall of the trench. The spacer may include a plurality of lateral layers including a first layer of a carbon-containing material adjacent a sidewall of the trench, a second layer comprising a first oxygen-containing material and a second oxygen-containing material different from the first oxygen-containing material, and a third layer of a nitrogen-containing material. The second layer of the spacer may be disposed between the first layer of the spacer and third layer of the spacer. The second layer of the spacer may at least partially extend laterally beneath the third layer of the spacer. The methods may include maintaining a relative humidity within the substrate processing region of the semiconductor processing chamber below or about 60%. The methods may also include removing the second layer of the spacer.

Such technology may provide numerous benefits over conventional systems and techniques. For example, the processes may allow high-aspect-ratio features to be etched without eroding other exposed materials. Additionally, the processes may allow formation of an airgap within a spacer feature that substantially maintains the other exposed materials. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Diluted acids may be used in many different semiconductor processes for cleaning substrates and removing materials from those substrates. For example, diluted hydrofluoric acid can be an effective etchant for silicon oxide, and may be used to remove silicon oxide from silicon surfaces. After the etching or cleaning operation is complete, the acid may be dried from the wafer or substrate surface. Using dilute hydrofluoric acid ("DHF") may be termed a "wet" etch, and the diluent is often water. Additional etching processes may be used that utilize precursors delivered to the substrate. For example, a plasma species may be delivered to a wafer along with water vapor to form an etchant mixture as well.

Although wet etchants using aqueous solutions or water-based processes may operate effectively for certain substrate structures, the water may pose issues when utilized on substrates having small pitch features to be removed. For example, an airgap formation process may selectively remove a thin layer of material on a substrate, which may be characterized by a thickness of a few nanometers. Because of the surface tension and other characteristics of the wet etchant, the etchant may be incapable of penetrating between additional layers to etch the layer through the surrounding structures. Depending on the location of the airgap, the feature may be characterized by a high aspect ratio, further limiting the ability of the wet etchant to extend through the feature. Accordingly, many conventional techniques are incapable of forming airgaps in certain device configurations.

The present technology overcomes these issues by performing a vapor-phase etch process that allows removal of material through high aspect ratio features. The processes may or may not utilize plasma effluents as part of the etchant recipes in different embodiments. The technology may be capable of selectively etching oxide-containing materials relative to carbon-containing or nitrogen-containing materials. Additionally, based on the spacer structure in certain embodiments, exposed carbon-containing or nitrogen-containing materials may be protected during the etching of what may conventionally otherwise be lower-selectivity etches. In embodiments in which a plasma may not be formed, formation of oxygen and hydroxyl radicals may be minimized, which may further protect surrounding structures.

Although the remaining disclosure will routinely identify specific etching processes utilizing the disclosed technology, it will be readily understood that the systems and methods are equally applicable to deposition and cleaning processes as may occur in the described chambers, as well as other etching technology including back-end-of-line air gap formation and other etching that may be performed with a variety of exposed materials that may be maintained or substantially maintained. Accordingly, the technology should not be considered to be so limited as for use with the exemplary etching processes or chambers alone. Moreover, although an exemplary chamber is described to provide foundation for the present technology, it is to be understood that the present technology can be applied to virtually any semiconductor processing chamber that may allow the operations described.

Figure 1:
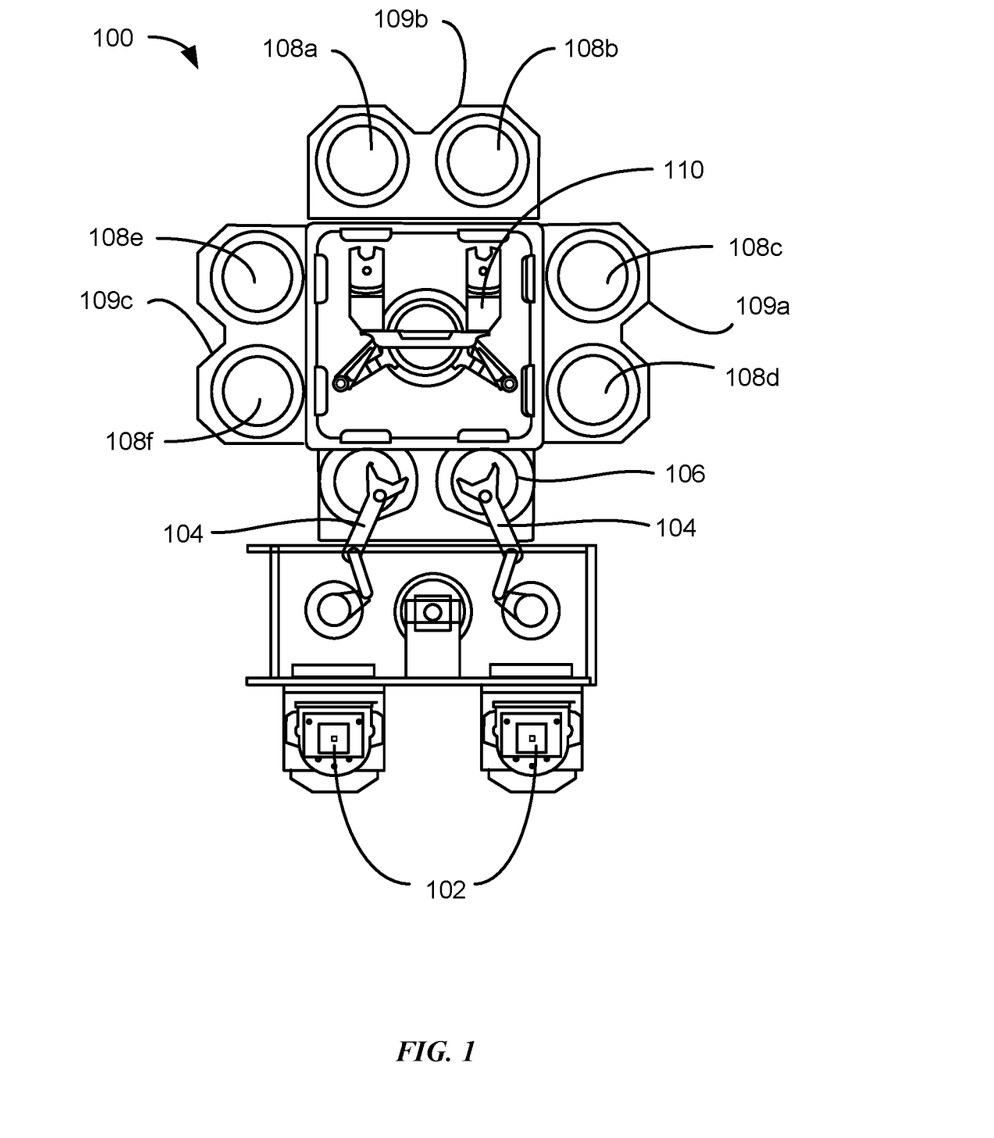
FIG. 1 shows a top plan view of one embodiment of an exemplary processing system according to embodiments of the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
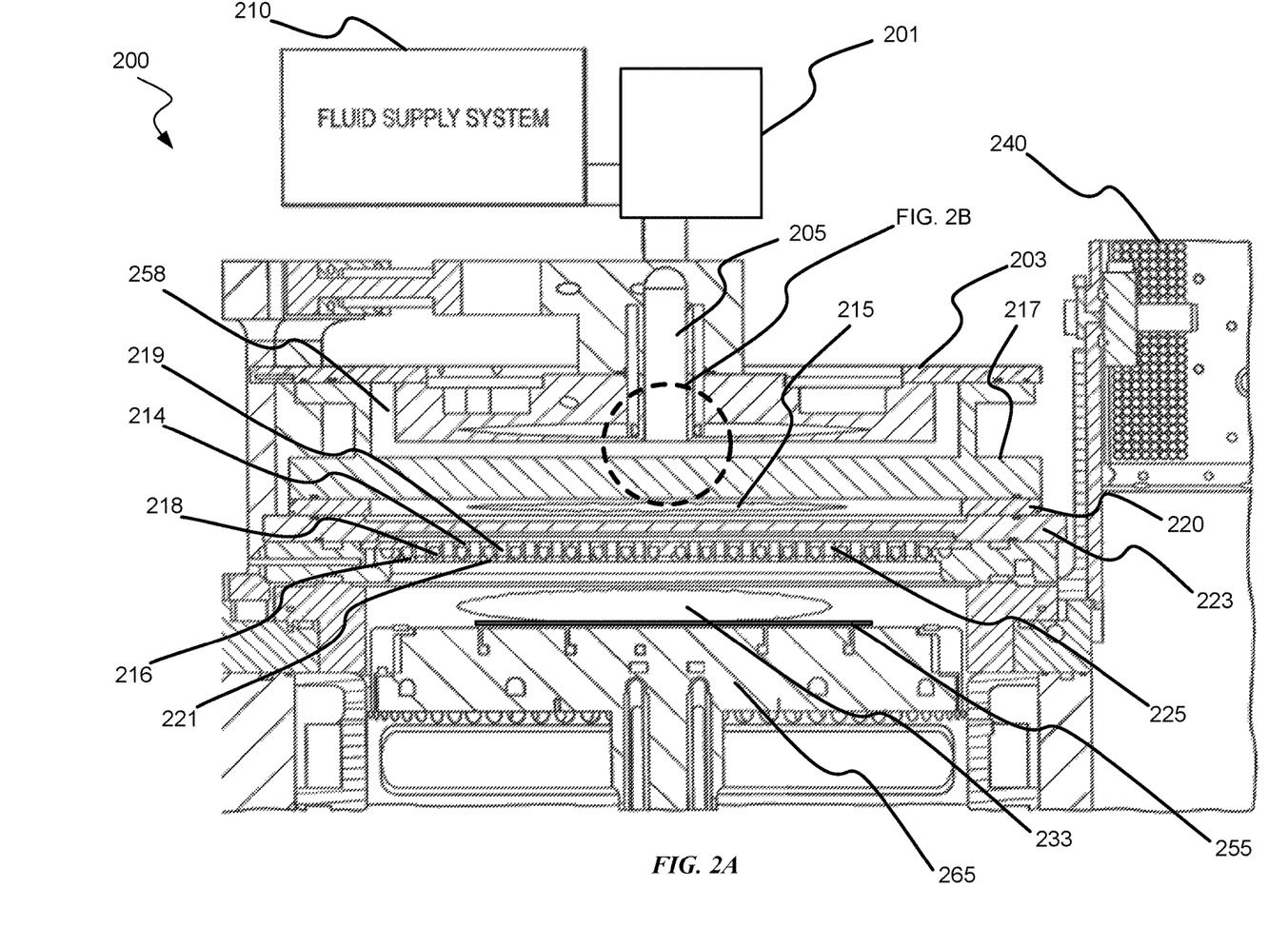
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
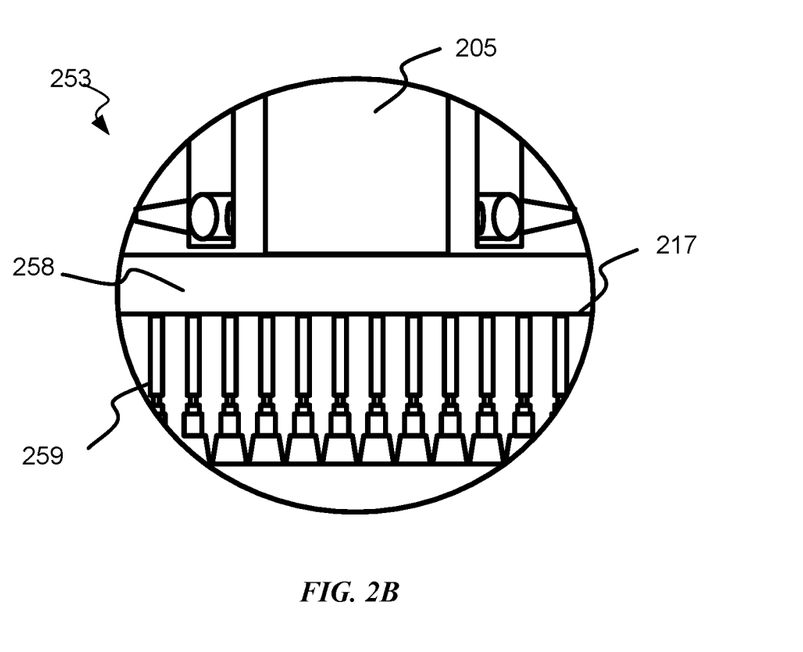
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
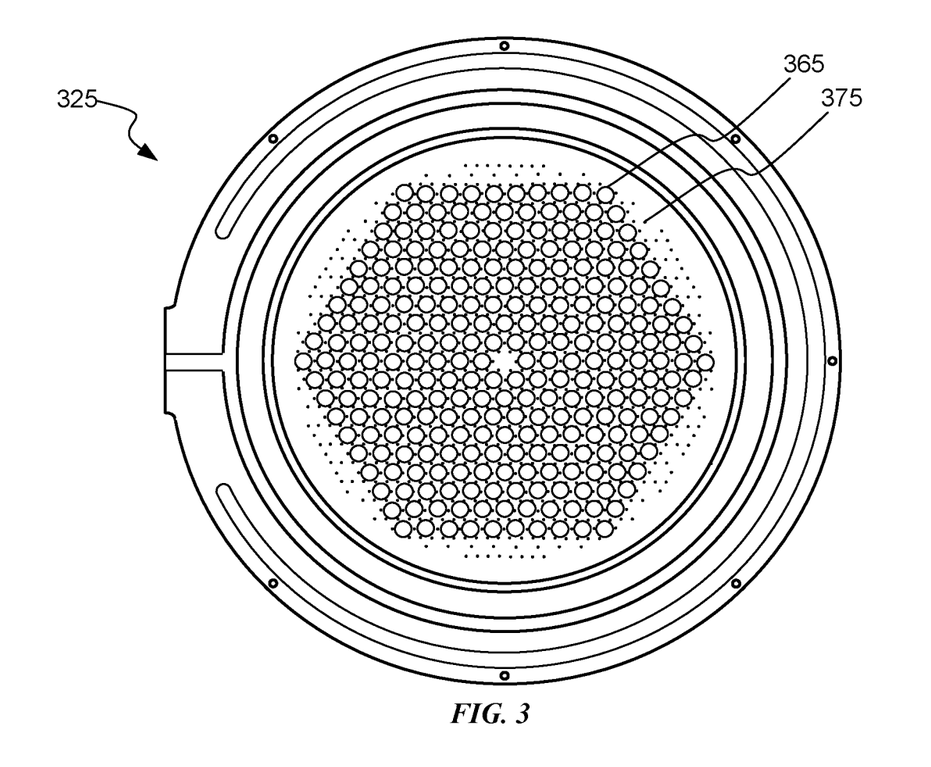
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
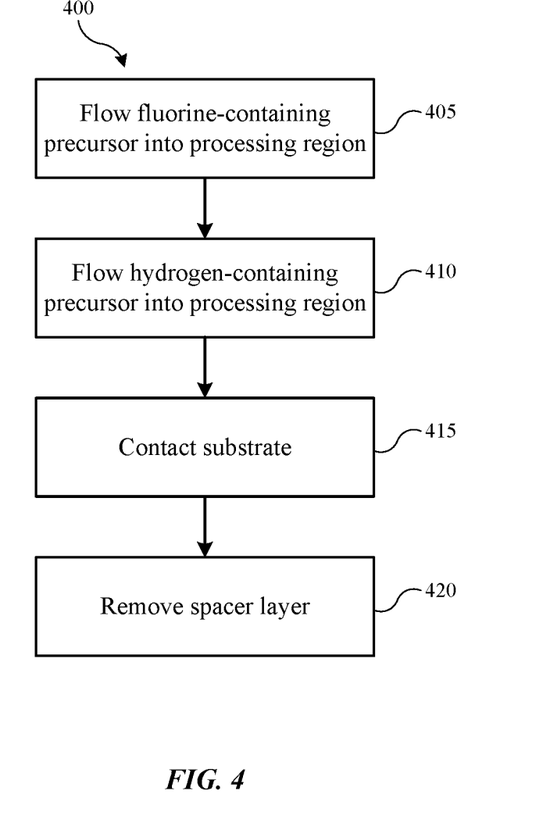
FIG. 4 shows exemplary operations in a method according to embodiments of the present technology.
Figure 5A:
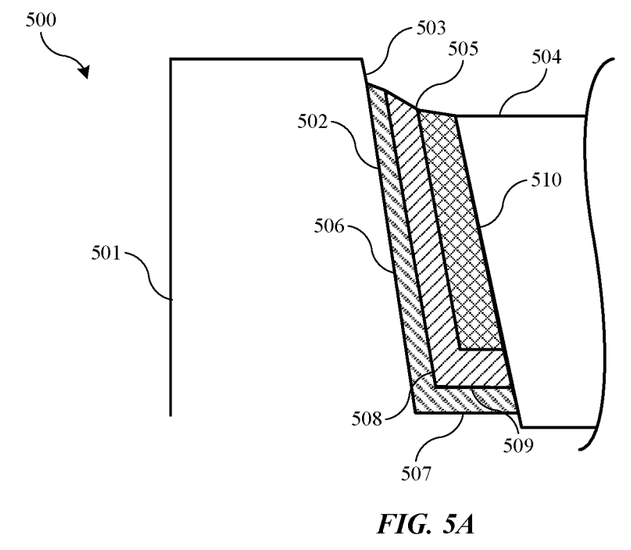
FIGS. 5A-5D show cross-sectional views of substrates being processed according to embodiments of the present technology.

The chamber discussed previously may be used in performing exemplary methods including etching methods. Turning to FIG. 4 is shown exemplary operations in a method 400 according to embodiments of the present technology. Method 400 may include one or more operations prior to the initiation of the method, including front end processing, deposition, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 400 describes operations shown schematically in FIGS. 5A-5D, the illustrations of which will be described in conjunction with the operations of method 400. It is to be understood that FIG. 5 illustrates only partial schematic views, and a substrate may contain any number of structural sections having aspects as illustrated in the figures, as well as alternative structural aspects that may still benefit from operations of the present technology Method 400 may involve optional operations to develop the semiconductor structure to a particular fabrication operation. As illustrated in FIG. 5A, the semiconductor structure may represent a device in which a trench, via, or other recessed feature has been formed in a substrate 501. As illustrated, structure 500 may include a substrate 501 made of or containing silicon or some other semiconductor substrate material as well as interlayer dielectric materials, on which a recess, trench, via, or isolation structure may be formed. Trench 503, which may also be a via or other recess that is similarly encompassed by the present technology, may include a spacer 505 structure formed between a sidewall 502 of substrate 501 and a material 504 formed or positioned within trench 503. Material 504 may be a metal material, a dielectric material, a contact material, a transistor material, or any other material that may be used in semiconductor processes.

Spacer 505 may include a number of layers formed laterally adjacent one another. For example, as illustrated in the figure, spacer 505 may include a first layer 506, a second layer 508, and a third layer 510. The spacer 505 may include any number of layers in different embodiments, although in some embodiments the spacer may include at least three layers of materials. Some methods of forming an airgap, such as in some embodiments of the present technology, may include forming a sacrificial layer between other layers of the spacer. During subsequent removal, the sacrificial layer may be removed to provide the airgap between the maintained layers of the spacer. In some embodiments, second layer 508 of spacer 505 may illustrate a sacrificial material to be removed from the substrate to produce an airgap between the first layer 506 and the third layer 510 of the spacer 505.

In some embodiments, such as illustrated, first layer 506 of spacer 505 and second layer 508 of spacer 505 may extend beneath the third layer 510 by some amount. As these layers may be formed over one another during fabrication, the last layer formed, such as third layer 510 may be seated or disposed over the other layers of the spacer 505. As illustrated, second layer 508 of spacer 505 may include a section 509 extending laterally beneath third layer 510. Similarly, first layer 506 may include a section 507 extending laterally beneath second layer 508, as well as third layer 510. In some embodiments, a lateral portion of the sacrificial spacer material may be removed during an etching operation.

It is to be understood that the illustration includes only a schematic view of a spacer according to some embodiments of the present technology, and is not drawn to any particular scale, but is instead illustrated to emphasize certain characteristics of possible structures encompassed by the present technology. For example, in some embodiments each layer may be formed to a similar thickness laterally, or any individual layer may be thicker than any other layer. Spacers according to the present technology may be characterized by any aspect ratios or the height-to-width ratio of the structure, although in some embodiments the spacers may be characterized by larger aspect ratios, which may not be allow for sufficient etching in conventional technology. For example, in some embodiments the aspect ratio of any layer of the spacer may be greater than or about 10:1, greater than or about 20:1, greater than or about 30:1, greater than or about 40:1, greater than or about 50:1, or greater. Additionally, each layer of spacer 505 may be characterized by a reduced width less than or about 10 nm, less than or about 8 nm, less than or about 6 nm, less than or about 5 nm, less than or about 4 nm, less than or about 3 nm, less than or about 2 nm, less than or about 1 nm, or less including any fraction of any of the stated numbers, such as 2.5 nm, 1.5 nm, etc.

This combination of high aspect ratios and minimal widths may frustrate many conventional etching operations, or require substantially longer etch times to remove a layer, such as layer 508, a long vertical distance through a confined width. In conventional technologies, spacer layer 510 may be more susceptible to etching during such processes because of the time of exposure to the chemical etchants. For example, first spacer layer 506 may be characterized by a higher quality or denser structure due to the process performed to produce second spacer layer 508. For example, formation of second spacer layer 508 may occur at a temperature greater than about 50° C., or greater than about 100° C., for example, which may provide a type of anneal or densification of first spacer layer 506. The same may not be true of third spacer layer 510, which may be formed subsequent formation of second layer 508. Accordingly, while sacrificial layer 508 may be removed vertically, the sidewalls of first spacer layer 506 and third spacer layer 510 may be exposed to the etchant. While the materials or quality of first spacer layer 506 may enhance the selectivity of the etchant with respect to first spacer layer 506, third spacer layer 510 may be roughened, or trimmed in the process. The longer the etchant may be in contact with the third spacer layer 510, either in total or in a number of cycles, the more removal may occur.

Figure 5B:
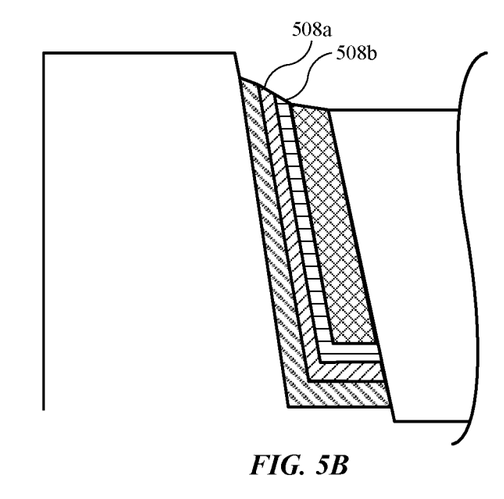

Accordingly, some embodiments of the present technology may use specific materials and processes to accommodate third spacer layer 510. For example, FIG. 5B illustrates a spacer structure 505 where second spacer layer 508 includes a first layer 508a, and a second layer 508b. Second layer 508b of second spacer layer 508 may be characterized by a different material than first layer 508a, as will be discussed further below, which may act as a protective layer over third spacer layer 510. When second spacer layer 508 includes multiple layers, the full width of second spacer layer 508 may still be less than or about 10 nm, less than or about 5 nm, or less than or about 3 nm in embodiments, with each layer of the second spacer layer contributing equal or different amounts to the overall thickness.

The materials encompassed by the present technology may include a variety of materials, such as silicon-containing materials, for each of the spacer layers. As previously discussed substrate 501 may include materials including silicon or polysilicon, silicon germanium, or other materials, including silicon oxide or other dielectric materials when the structure represents material formed overlying a substrate. Although not illustrated, one or more capping materials may be formed over the exposed upper surface of substrate 501, and may include oxide and/or nitride materials, or any of the other materials noted here. Spacer 505 may be characterized by multiple layers, each layer of which may be any number of materials. For example, any of the layers may be or include silicon oxide, silicon oxycarbide, silicon oxycarbonitride, silicon carbon nitride, or silicon nitride. In some embodiments adjacent layers of spacer 505 may be different materials. For example, second spacer layer 508 may be a different material from first spacer layer 506 and third spacer layer 510, although first spacer layer 506 may be the same material as third spacer layer 510.

In some embodiments, first spacer layer 506 and third spacer layer 510 may be or include a carbon-containing or nitrogen-containing material, such as any of the nitride-containing materials noted above, and second spacer layer 508 may be or include an oxygen-containing material, such as any of the oxygen-containing materials noted above. For example, one possible combination of materials may include silicon carbon nitride for the first spacer layer 506, silicon oxide, silicon oxycarbide, or silicon oxycarbonitride as the second spacer layer 508, and silicon nitride as the third spacer layer 510. In embodiments including multiple sacrificial layers, such as illustrated in FIG. 5B, first layer 508a may be silicon oxide, and second layer 508b may be an oxygen-containing material characterized by a different oxygen content, such as a lower oxygen content or stoichiometrically lower amount of oxygen, than first layer 508a. As will be explained below, such configurations may advantageously protect third layer 510 from additional etching in embodiments.

The method 400 may be performed to remove second spacer layer 508, or layers 508a, 508b in embodiments. The method may include flowing a fluorine-containing precursor into a substrate processing region of a semiconductor processing chamber at operation 405. The fluorine-containing precursor may be flowed through a remote plasma region of the processing chamber, such as region 215 described above, although in some embodiments method 400 may not utilize plasma effluents. For example, method 400 may flow a fluorine-containing or other halogen-containing precursor to the substrate without exposing the precursor to a plasma.

A hydrogen-containing precursor may be flowed into the substrate processing region at operation 410. The hydrogen-containing precursor and the fluorine-containing precursor may be co-flowed into the processing region, and may be flowed through different or similar portions of the processing chamber. For example, both precursors may be flowed through an entrance to the chamber, or the fluorine-containing precursor may be flowed through a first access to the chamber, and the hydrogen-containing precursor may be flowed through a second access to the chamber. At operation 415, the fluorine-containing precursor and the hydrogen-containing precursor may contact a semiconductor substrate including a spacer structure, such as illustrated in FIG. 5. At operation 420 at least a portion of the second spacer 508, which may be an oxygen-containing material, may be removed while maintaining additional layers of spacer 505, such as first layer 506 and third layer 510.

Precursors used in the method may include a fluorine-containing precursor or a halogen-containing precursor. An exemplary fluorine-containing precursor may be nitrogen trifluoride ($NF_3$), which may be flowed into the remote plasma region, which may be separate from, but fluidly coupled with, the processing region. Other sources of fluorine may be used in conjunction with or as replacements for the nitrogen trifluoride. In general, a fluorine-containing precursor may be flowed into the remote plasma region and the fluorine-containing precursor may include at least one precursor selected from the group of atomic fluorine, diatomic fluorine, nitrogen trifluoride, carbon tetrafluoride, hydrogen fluoride including anhydrous hydrogen fluoride, xenon difluoride, and various other fluorine-containing precursors used or useful in semiconductor processing. The precursors may also include any number of carrier gases, which may include nitrogen, helium, argon, or other noble, inert, or useful precursors. Although a plasma may be formed in the process, in some embodiments the fluorine-containing precursor may not be plasma enhanced or radicalized prior to being delivered to the substrate processing region, and in some embodiments no plasma may be formed in exemplary processes.

The hydrogen-containing precursor may include hydrogen, a hydrocarbon, water vapor, an alcohol, hydrogen peroxide, or other materials that may include hydrogen as would be understood by the skilled artisan. Additional precursors such as carrier gases or inert materials may be included with the secondary precursors as well. In some embodiments, the hydrogen-containing precursor, such as water vapor, may be maintained fluidly isolated from a plasma that may be formed within the remote plasma region. In some embodiments, no plasma may be formed during the etching methods to aid in protecting carbon-containing or nitrogen-containing materials, such as the spacer layers surrounding the sacrificial layer. Although selectivity of a plasma process may etch oxide materials faster than nitride materials, because of the high aspect ratios and relatively thin material widths described above, exposure of sidewalls of third spacer layer 510 to an etchant including water vapor may cause thinning to occur during the removal, which may not maintain sufficient thickness of the third spacer layer. In embodiments, the plasma processing region may be maintained plasma free during the removal operations. By plasma free is meant that plasma may not be actively formed within the processing region during the operations, although plasma effluents produced remotely as described earlier, may be used during the operations.

The reaction process with water vapor and a halogen-containing precursor, which may be a fluorine-containing precursor or other halogen, may dissociate the fluorine-containing materials to form an etchant. The silicon oxide, or other oxygen-containing material, may receive a proton, such as hydrogen, and the material may then be etched by the etchant to produce volatile components and other reaction byproducts. Additionally, some conventional techniques may perform processes that produce solid byproducts that are removed prior to continued etching, which may be performed in cycles of etching and then removal of byproducts. Such processes may be more time consuming for high aspect ratio features, which may require many cycles to complete the etch process. The present technology may not suffer from these deficiencies, as solid byproducts may not be formed, and the etching may initiate upon contact with the oxide material. For example, the hydrogen-containing precursor, which may be water vapor, may condense on the surface of the substrate, and may interact with the fluorine-containing precursor, which may dissociate and begin etching without incubation. Accordingly, the etching operations may be performed in a single cycle in some embodiments, although multiple cycles of etching may be performed. Additionally, the process may fully remove the second spacer layer 508 in a time period less than or about 30 minutes, less than or about 25 minutes, less than or about 20 minutes, less than or about 15 minutes, less than or about 10 minutes, less than or about 5 minutes, or less.

Figure 5C:
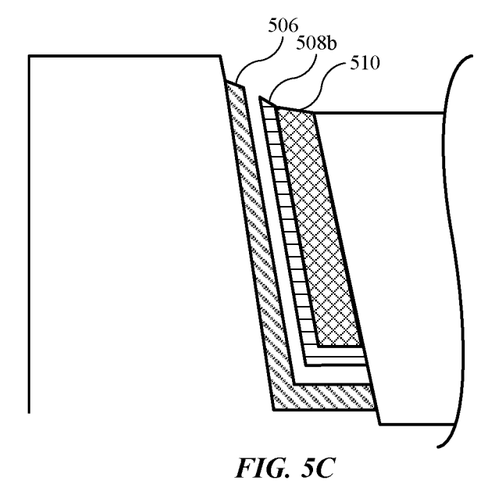

Turning to FIG. 5C is shown embodiments in which second spacer layer 508 is removed in sections to limit reduction of third spacer layer 510. When second layer 508b of second spacer 508 includes additional carbon or nitrogen content, or lower oxygen-content as compared to first layer 508a, the second layer 508b may be characterized by a lower etch rate than first layer 508a. Accordingly, first layer 508a may be substantially or completely removed prior to extensive removal of second layer 508b, such as less than 50% removal, less than or about 60% removal, less than or about 70% removal, less than or about 80% removal, less than or about 90% removal, or prior to full exposure of a sidewall of third spacer layer 510. The second layer 508b may be characterized by a relatively slow etch rate if etching was only to occur from a top down approach, and such a scenario may expose third spacer layer 510 to etchant for a sufficient period of time to damage the layer. However, by forming a gap between first spacer layer 506 and second layer 508b, etchant may fill the void and fully expose second layer 508b. Additionally, because the etch may then be performed partially, substantially, or essentially laterally, the distance of the etch may be less than or about 5 nm, which may greatly reduce the time to remove second layer 508b.

Figure 5D:
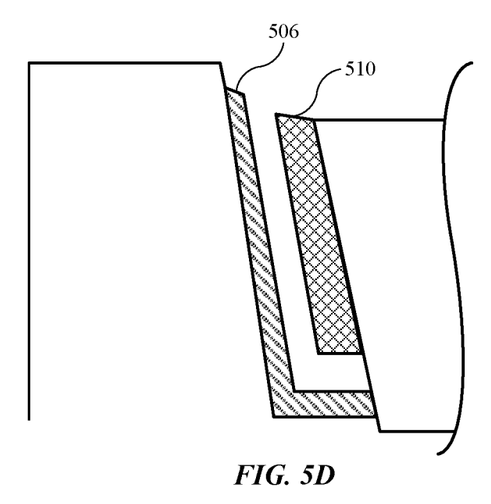

Second layer 508b may then be fully removed, as illustrated in FIG. 5D, while substantially or essentially maintaining third spacer layer 510 and first spacer layer 506.

Although partial rounding at top portions of spacer layer 510 may occur depending on the materials forming each layer of the spacer 505, minimal removal of spacer layer 510 may occur, and the layer may be more than 50% maintained from an initial formation amount. In some embodiments third spacer layer 510 may be more than 60% maintained from an initial formation amount, more than 70% maintained from an initial formation amount, more than 80% maintained from an initial formation amount, more than 90% maintained from an initial formation amount, more than 95% maintained from an initial formation amount, more than 97% maintained from an initial formation amount, more than 99% maintained from an initial formation amount, or more. The airgap formed by the technology may extend the vertical length, or horizontal depending on orientation, between first spacer layer 506 and third spacer layer 510, as well as the full lateral distance beneath third spacer layer 510.

Process conditions may also impact the operations performed in method 400 as well as other removal methods according to the present technology. Each of the operations of method 400 may be performed during a constant temperature in embodiments, while in some embodiments the temperature may be adjusted during different operations. For example, the substrate, pedestal, or chamber temperature during the method 400 may be maintained below or about 50° C. in embodiments. The substrate temperature may also be maintained below or about 45° C., below or about 40° C., below or about 35° C., below or about 30° C., below or about 25° C., below or about 20° C., below or about 15° C., below or about 10° C., below or about 5° C., below or about 0° C., below or about −5° C., or lower. The temperature may also be maintained at any temperature within these ranges, within smaller ranges encompassed by these ranges, or between any of these ranges.

The pressure within the chamber may also affect the operations performed, and in embodiments the chamber pressure may be maintained below about 50 Torr, below or about 40 Torr, below or about 30 Torr, below or about 25 Torr, below or about 20 Torr, below or about 15 Torr, below or about 10 Torr, below or about 5 Torr, below or about 1 Torr, or less. The pressure may also be maintained at any pressure within these ranges, within smaller ranges encompassed by these ranges, or between any of these ranges. By performing the operations at pressures below about 30 Torr, the selectivity of the process with respect to a carbon-containing or nitrogen-containing material may be increased.

The pressure may also be utilized to maintain a particular relative humidity during the etching or removal operations. In some embodiments, the relative humidity within the processing chamber may be maintained below about 75% during the entire etching operation, which may facilitate improved removal of oxygen-containing materials. In other embodiments, the relative humidity may be maintained below or about 50%, below or about 45%, below or about 40%, below or about 35%, below or about 30%, below or about 25%, below or about 20% below or about 15%, below or about 10%, or lower. The relative humidity may also be maintained between any of these numbers, or at any smaller range included within these ranges.

The flow rates of one or more of the precursors may also be adjusted with any of the other processing conditions. For example, a flow rate of the fluorine-containing precursor may be reduced, maintained, or increased during the removal operations. During any of the operations of method 400, the flow rate of the fluorine-containing precursor may be between about 5 sccm and about 1,000 sccm. Additionally, the flow rate of the fluorine-containing precursor may be at least or about 10 sccm, at least or about 25 sccm, at least or about 50 sccm, at least or about 100 sccm, at least or about 150 sccm, at least or about 200 sccm, at least or about 250 sccm, at least or about 300 sccm, at least or about 400 sccm, at least or about 500 sccm, at least or about 700 sccm, at least or about 900 sccm, or more. The flow rate may also be between any of these stated flow rates, or within smaller ranges encompassed by any of these numbers.

The hydrogen-containing precursor may be flowed at any of these flow rates depending on the precursor used, which may be any number of hydrogen-containing precursors. For example, in embodiments in which water vapor is utilized, the vapor may be introduced at a rate of at least or about 0.1 g/min. The water vapor may also be introduced at a rate of at least or about 0.2 g/min, at least or about 0.3 g/min, at least or about 0.4 g/min, at least or about 0.5 g/min, at least or about 0.6 g/min, at least or about 0.7 g/min, at least or about 0.8 g/min, at least or about 0.9 g/min, at least or about 1 g/min, at least or about 1.5 g/min, or more, although the vapor may be introduced below about 5 g/min or below or about 1 g/min to reduce or limit condensation on components and the substrate. The water vapor may also be introduced at a flow rate between any of these stated flow rates, or within smaller ranges encompassed by any of these numbers.

The present technology may selectively etch silicon oxide, silicon oxycarbide, silicon oxycarbonitride, or other oxygen-containing materials relative to other materials, and may selectively etch some types of silicon oxide relative to other types of silicon oxide. For example, the present technology may etch deposited silicon oxides relative to thermal oxide at a rate of at least about 10:1, and may etch deposited oxides relative to thermal oxide at a rate of at least about 15:1, at least about 20:1, at least about 50:1, at least about 100:1, or more. Deposited oxides may include spin on dielectrics, or deposition techniques including CVD, PECVD, and other deposition techniques. The present technology may also etch any of the oxygen-containing materials relative to silicon nitride, silicon carbon nitride films having any ratio of carbon and nitrogen, or silicon oxycarbonitride, at a rate of at least about 20:1, at least about 25:1, at least about 30:1, at least about 50:1, at least about 100:1, at least about 150:1, at least about 200:1, at least about 250:1, at least about 300:1, at least about 350:1, at least about 400:1, at least about 450:1, at least about 500:1, or more.

The previously discussed methods may allow the removal of oxide material from a substrate to form an airgap between two layers of carbon-containing and/or nitrogen-containing materials, while maintaining critical dimensions of the carbon-containing and/or nitrogen-containing features, which may be high-aspect-ratio features, and while maintaining other materials including metal and metal-containing materials, and other silicon-containing materials. By utilizing the present methods and operations, high-aspect-ratio features having relatively thin widths of initial exposure may be etched while not causing pattern collapse, unlike wet etching, and while not removing or while substantially maintaining exposed spacer layers, unlike some conventional dry etching.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
   flowing a fluorine-containing precursor into a substrate processing region of a semiconductor processing chamber;
   flowing a hydrogen-containing precursor into the substrate processing region;
   contacting a substrate housed in the substrate processing region with the fluorine-containing precursor and the hydrogen-containing precursor, wherein the substrate comprises a trench, wherein a spacer is formed along a sidewall of the trench, wherein the spacer includes a plurality of layers including a first layer of a carbon-containing material and a second layer of an oxygen-containing material, and wherein the second layer of the spacer is disposed adjacent the first layer of the spacer; and
   removing the oxygen-containing material, wherein the substrate processing region is maintained plasma free during the etching method.

2. The etching method of claim 1, wherein the hydrogen-containing precursor is maintained fluidly isolated from a plasma formable within the semiconductor processing chamber in a remote plasma region of the semiconductor processing chamber.

3. The etching method of claim 1, wherein the hydrogen-containing precursor comprises water vapor.

4. The etching method of claim 1, wherein the fluorine-containing precursor comprises anhydrous hydrogen fluoride.

5. The etching method of claim 1, wherein each layer of the spacer is characterized by an aspect ratio greater than or about 20:1.

6. The etching method of claim 5, wherein the oxygen-containing material is characterized by a width of less than or about 5 nm.

7. The etching method of claim 1, wherein a temperature of the substrate is maintained below or about 10° C. during the etching method.

8. The etching method of claim 1, wherein the spacer further comprises a third layer positioned adjacent the second layer and a fourth layer positioned between the second layer and the third layer, and wherein the fourth layer is an oxygen-containing material.

9. The etching method of claim 8, wherein the fourth layer of the spacer is characterized by a stoichiometrically lower amount of oxygen than the second layer of the spacer.

10. A removal method comprising:
    flowing a fluorine-containing precursor into a substrate processing region of a semiconductor processing chamber;
    flowing water vapor into the substrate processing region;
    contacting a substrate housed in the substrate processing region with the fluorine-containing precursor and the water vapor, wherein the substrate comprises a trench, wherein a spacer is formed along a sidewall of the trench, wherein the spacer includes a plurality of lateral layers including a first layer of a carbon-containing material adjacent a sidewall of the trench and a second layer comprising an oxygen-containing material;
    maintaining a relative humidity within the substrate processing region of the semiconductor processing chamber below or about 60%; and
    removing the second layer of the spacer.

11. The removal method of claim 10, wherein the second layer of the spacer comprises a first oxygen-containing layer adjacent the first layer of the spacer and a second oxygen-containing layer.

12. The removal method of claim 11, wherein the second oxygen-containing layer is characterized by a lower oxygen content than the first oxygen-containing layer.

13. The removal method of claim 11, wherein removing the second layer of the spacer comprises:
    removing the first oxygen-containing layer in a top-to-bottom etch; and
    subsequently removing the second oxygen-containing layer in a lateral etch.

14. The removal method of claim 13, wherein the first layer of the spacer is substantially maintained during the second layer removal.

15. The removal method of claim 14, wherein the spacer includes a third layer, and wherein the second layer of the spacer is removed at a selectivity relative to the third layer of the spacer of greater than or about 50:1.

16. The removal method of claim 15, wherein the first layer of the spacer and the third layer of the spacer comprise silicon nitride or silicon carbon nitride.

17. The removal method of claim 15, wherein the second layer of the spacer extends beneath the third layer of the spacer, and wherein the method further comprises laterally etching the second spacer layer from beneath the third layer of the spacer.

18. The removal method of claim 10, wherein the fluorine-containing precursor is anhydrous hydrogen fluoride, and wherein the substrate processing region is maintained plasma-free during the removal method.

19. An etching method comprising:
flowing anhydrous hydrogen fluoride into a substrate processing region of a semiconductor processing chamber;
flowing water vapor into the substrate processing region;
contacting a substrate housed in the substrate processing region with the anhydrous hydrogen fluoride and the water vapor, wherein the substrate comprises a trench, wherein a spacer is formed along a sidewall of the trench, wherein the spacer includes a plurality of lateral layers including a first layer of a carbon-containing material adjacent a sidewall of the trench and a second layer comprising a first oxygen-containing material and a second oxygen-containing material different from the first oxygen-containing material;
maintaining a relative humidity within the substrate processing region of the semiconductor processing chamber below or about 60%; and
removing the second layer of the spacer.

* * * * *